(12) United States Patent
Nagasaka

(10) Patent No.: US 7,580,114 B2
(45) Date of Patent: Aug. 25, 2009

(54) EXPOSURE APPARATUS AND METHOD FOR MANUFACTURING DEVICE

(75) Inventor: Hiroyuki Nagasaka, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/882,206

(22) Filed: Jul. 31, 2007

(65) Prior Publication Data

US 2008/0018873 A1 Jan. 24, 2008

Related U.S. Application Data

(60) Division of application No. 11/325,654, filed on Jan. 5, 2006, now Pat. No. 7,379,157, which is a continuation of application No. PCT/JP2004/009999, filed on Jul. 7, 2004.

(30) Foreign Application Priority Data

Jul. 9, 2003 (JP) ............... 2003-272616

(51) Int. Cl.
*G03B 27/42* (2006.01)
*G03B 27/58* (2006.01)
*G03B 27/52* (2006.01)

(52) U.S. Cl. ............... 355/53; 355/72; 355/55

(58) Field of Classification Search .......... 355/53, 355/30, 55, 72, 77; 359/665
See application file for complete search history.

(56) References Cited

U.S. PATENT DOCUMENTS

| 4,346,164 A | 8/1982 | Tabarelli et al. |
| 4,480,910 A | 11/1984 | Takanashi et al. |
| 5,610,683 A | 3/1997 | Takahashi |
| 5,715,039 A | 2/1998 | Fukuda et al. |

(Continued)

FOREIGN PATENT DOCUMENTS

DE 221 563 A1 4/1985

(Continued)

OTHER PUBLICATIONS

B.J. Lin; "Semiconductor Foundry, Lithography, and Partners"; Plenary Paper; *Emerging Lithographic Technologies VI*; Proceedings of SPIE; vol. 4688; 2002; pp. 11-24.

(Continued)

*Primary Examiner*—Peter B Kim
(74) *Attorney, Agent, or Firm*—Oliff & Berridge, PLC

(57) ABSTRACT

An exposure apparatus which exposes a substrate by projecting an image of a pattern, via an projection optical system and a liquid of a liquid immersion area formed on the substrate, onto the substrate, includes a liquid supply mechanism having supply ports for supplying the liquid on both sides of a projection area respectively and capable of simultaneously supplying the liquid from the supply ports, the image of the pattern being projected onto the projection area. The liquid supply mechanism supplies the liquid from only one of the supply ports disposed on the both sides when the mechanism starts to supply the liquid. The liquid may be supplied while moving an object such as a substrate placed to face the projection optical system. Accordingly, an optical path space on the image side of the projection optical system can be filled with the liquid quickly while suppressing formation of air bubbles.

20 Claims, 8 Drawing Sheets

U.S. PATENT DOCUMENTS

| | | |
|---|---|---|
| 5,825,043 A | 10/1998 | Suwa |
| 2002/0163629 A1 | 11/2002 | Switkes et al. |
| 2003/0030916 A1 | 2/2003 | Suenaga |
| 2003/0174408 A1 | 9/2003 | Rostalski et al. |
| 2004/0000627 A1 | 1/2004 | Schuster |
| 2004/0075895 A1 | 4/2004 | Lin |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Maria Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0233405 A1 | 11/2004 | Kato et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2004/0263809 A1 | 12/2004 | Nakano |
| 2005/0002004 A1 | 1/2005 | Kolesnychenko et al. |
| 2005/0007569 A1 | 1/2005 | Streefkerk et al. |
| 2005/0007570 A1 | 1/2005 | Streefkerk et al. |
| 2005/0018155 A1 | 1/2005 | Cox et al. |
| 2005/0018156 A1 | 1/2005 | Mulkens et al. |
| 2005/0024609 A1 | 2/2005 | De Smit et al. |
| 2005/0030497 A1 | 2/2005 | Nakamura |
| 2005/0030498 A1 | 2/2005 | Mulkens |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0042554 A1 | 2/2005 | Dierichs et al. |
| 2005/0046934 A1 | 3/2005 | Ho et al. |
| 2005/0048223 A1 | 3/2005 | Pawloski et al. |
| 2005/0068639 A1 | 3/2005 | Pierrat et al. |
| 2005/0073670 A1 | 4/2005 | Carroll |
| 2005/0084794 A1 | 4/2005 | Meagley et al. |
| 2005/0094116 A1 | 5/2005 | Flagello et al. |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0132914 A1 | 6/2005 | Mulkens et al. |
| 2005/0134815 A1 | 6/2005 | Van Santen et al. |
| 2005/0134817 A1 | 6/2005 | Nakamura |
| 2005/0141098 A1 | 6/2005 | Schuster |
| 2005/0145265 A1 | 7/2005 | Ravkin et al. |
| 2005/0145803 A1 | 7/2005 | Hakey et al. |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0175940 A1 | 8/2005 | Dierichs |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1 | 10/2005 | Cox et al. |
| 2005/0219482 A1 | 10/2005 | Baselmans et al. |
| 2005/0219499 A1 | 10/2005 | Maria Zaal et al. |
| 2005/0225737 A1 | 10/2005 | Weissenrieder et al. |
| 2005/0231694 A1 | 10/2005 | Kolesnychenko et al. |
| 2005/0237501 A1 | 10/2005 | Furukawa et al. |
| 2005/0243292 A1 | 11/2005 | Baselmans et al. |
| 2005/0245005 A1 | 11/2005 | Benson |
| 2005/0253090 A1 | 11/2005 | Gau et al. |
| 2005/0259232 A1 | 11/2005 | Streefkerk et al. |
| 2005/0259233 A1 | 11/2005 | Streefkerk et al. |
| 2005/0264778 A1 | 12/2005 | Lof et al. |
| 2005/0270505 A1 | 12/2005 | Smith |
| 2006/0209286 A1* | 9/2006 | Nakano ................. 355/53 |

FOREIGN PATENT DOCUMENTS

| | | |
|---|---|---|
| DE | 224 448 A1 | 7/1985 |
| EP | 0 060 729 A2 | 9/1982 |
| JP | A 57-153433 | 9/1982 |
| JP | A 58-202448 | 11/1983 |
| JP | A 59-19912 | 2/1984 |
| JP | U 61-94342 | 6/1986 |
| JP | A 62-65326 | 3/1987 |
| JP | A 63-157419 | 6/1988 |
| JP | A 4-305915 | 10/1992 |
| JP | A 4-305917 | 10/1992 |
| JP | A 5-62877 | 3/1993 |
| JP | A 6-124873 | 5/1994 |
| JP | A 7-220990 | 8/1995 |
| JP | A 8-316125 | 11/1996 |
| JP | A 10-303114 | 11/1998 |
| JP | A 10-340846 | 12/1998 |
| JP | A 11-176727 | 7/1999 |
| JP | A 2000-58436 | 2/2000 |
| WO | WO 99/49504 | 9/1999 |
| WO | WO 02/091078 A1 | 11/2002 |
| WO | WO 03/077037 A1 | 9/2003 |
| WO | WO 2004/019128 A2 | 3/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/001572 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |

| | | | |
|---|---|---|---|
| WO | WO 2005/034174 A2 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |
| WO | WO 2005/119368 A2 | 12/2005 |
| WO | WO 2005/119369 A1 | 12/2005 |

OTHER PUBLICATIONS

M. Switkes et al.; "Resolution Ehancement of 157 nm Lithography by Liquid Immersion"; *Optical Microlithography XV*; Proceedings of SPIE; vol. 4691; 2002; pp. 459-465.

M. Switkes et al.; "Resolution Ehancement of 157 nm Lithography by Liquid Immersion"; *Journal of Microlith., Microfab., Microsyst.*; vol. 1, No. 3; Oct. 2002; pp. 1-4.

Soichi Owa et al.; "Nikon F2 Exposure Tool"; Nikon Corporation; $3^{rd}$ 157 nm Symposium; Sep. 4, 2002; 25 pg slides (slides 1-25).

Soichi Owa; "Immersion Lithography"; Nikon Corporation; Immersion Lithography Workshop; Dec. 11, 2002; 24 pg slides (slides 1-24).

Soichi Owa et al.; "Immersion Lithography; Its Potential Performance and Issues"; *Optical Microlithography XVI*; Proceedings of SPIE; vol. 5040; 2003; pp. 724-733.

Soichi Owa et al.; "Potential Performance and Feasibility of Immersion Lithography"; Nikon Corporation; NGL Workshop; Jul. 10, 2003; 33 pg slides (slides 1-33).

S. Owa et al.; "Update on 193nm Immersion Exposure Tool"; Nikon Corporation; Immersion Workshop; Jan. 27, 2004; 38 pg slides (slides 1-38).

S. Owa et al.; "Update on 193nm Immersion Exposure Tool"; Nikon Corporation; Litho Forum; Jan. 28, 2004; 51 pg slides (slides 1-51).

\* cited by examiner

EXPOSURE APPARATUS AND METHOD FOR MANUFACTURING DEVICE

CROSS-REFERENCE

This is a Division of application Ser. No. 11/325,654 filed Jan. 5, 2006, which in turn is a Continuation Application of International Application No. PCT/JP2004/009999 which was filed on Jul. 7, 2004 claiming the conventional priority of Japanese patent Application No. 2003-272616 filed on Jul. 9, 2003. The disclosure of the prior applications is hereby incorporated by reference herein in its entirety.

BACKGROUND OF THE INVENTION

1. Field of the Invention

The present invention relates to an exposure apparatus and a method for producing a device in which a substrate is exposed with a pattern in such a state that a liquid immersion area is formed between a projection optical system and the substrate.

2. Description of the Related Art

Semiconductor devices and liquid crystal display devices are produced by means of the so-called photolithography technique in which a pattern formed on a mask is transferred onto a photosensitive substrate. The exposure apparatus, which is used in the photolithography step, includes a mask stage for supporting the mask and a substrate stage for supporting the substrate. The pattern on the mask is transferred onto the substrate via a projection optical system while successively moving the mask stage and the substrate stage. In recent years, it is demanded to realize the higher resolution of the projection optical system in order to respond to the further advance of the higher integration of the device pattern. As the exposure wavelength to be used is shorter, the resolution of the projection optical system becomes higher. As the numerical aperture of the projection optical system is larger, the resolution of the projection optical system becomes higher. Therefore, the exposure wavelength, which is used for the exposure apparatus, is shortened year by year, and the numerical aperture of the projection optical system is increased as well. The exposure wavelength, which is dominantly used at present, is 248 nm of the KrF excimer laser. However, the exposure wavelength of 193 nm of the ArF excimer laser, which is shorter than the above, is also practically used in some situations. When the exposure is performed, the depth of focus (DOF) is also important in the same manner as the resolution. The resolution R and the depth of focus δ are represented by the following expressions respectively.

$$R = k_1 \cdot \lambda / NA \quad (1)$$

$$\delta = \pm k_2 \cdot \lambda / NA^2 \quad (2)$$

In the expressions, λ represents the exposure wavelength, NA represents the numerical aperture of the projection optical system, and $k_1$ and $k_2$ represent the process coefficients. According to the expressions (1) and (2), the following fact is appreciated. That is, when the exposure wavelength λ is shortened and the numerical aperture NA is increased in order to enhance the resolution R, then the depth of focus δ is narrowed.

If the depth of focus δ is too narrowed, it is difficult to match the substrate surface with respect to the image plane of the projection optical system. It is feared that the focus margin is insufficient during the exposure operation. Accordingly, the liquid immersion method has been suggested, which is disclosed, for example, in International Publication No. 99/49504 as a method for substantially shortening the exposure wavelength and widening the depth of focus. In this liquid immersion method, the space between the lower surface of the projection optical system and the substrate surface is filled with a liquid such as water or any organic solvent to form a liquid immersion area so that the resolution is improved and the depth of focus is magnified about n times by utilizing the fact that the wavelength of the exposure light beam in the liquid is 1/n as compared with that in the air (n represents the refractive index of the liquid, which is about 1.2 to 1.6 in ordinary cases).

For example, when the liquid immersion area is formed on the substrate placed on the substrate stage after the substrate is loaded on the substrate stage, it is required that the space between the substrate and the projection optical system should be filled with the liquid in a short period of time in view of the improvement in the throughput. If any bubble or the like is present in the liquid, the image of the pattern to be formed on the substrate is consequently deteriorated. Therefore, it is required that the liquid immersion area should be formed in a state in which no bubble is present.

SUMMARY OF THE INVENTION

The present invention has been made taking the foregoing circumstances into consideration, an object of which is to provide an exposure apparatus and a method for producing a device, in which the space between a projection optical system and a substrate can be quickly filled with a liquid while suppressing the formation of any bubble or the like, and the exposure process can be performed at a high throughput without causing any deterioration of an image of a pattern.

In order to achieve the object as described above, the present invention adopts the following constructions.

According to a first aspect of the present invention, there is provided an exposure apparatus which exposes a substrate by projecting an image of a pattern through a liquid onto the substrate, the exposure apparatus comprising:

a projection optical system which projects the image of the pattern onto the substrate; and a liquid supply mechanism which has supply ports for supply of the liquid on both sides of a projection area respectively and which supplies the liquid from the supply ports, the image of the pattern being projected onto the projection area by the projection optical system wherein:

the liquid supply mechanism supplies the liquid from only one of the supply ports disposed on the both sides when the liquid supply mechanism starts the supply of the liquid.

According to a second aspect of the present invention, there is provided an exposure method for exposing a substrate by projecting an image of a pattern through a liquid onto the substrate, the exposure method comprising:

starting supply of the liquid from one side of a projection area to the projection area onto which the image of the pattern is to be projected, before performing exposure operation;

supplying the liquid from both sides of the projection area during the exposure operation; and exposing the substrate by projecting the image of the pattern onto the substrate through the supplied liquid.

According to the first and second aspects of the present invention, the supply of the liquid is started from only one supply port of the supply ports arranged on the both sides of the projection area to form the liquid immersion area. Accordingly, it is possible to quickly form the liquid immersion area while suppressing the formation of any bubble or the like. The mutual collision or the interference of the liquid, which flows in the opposite directions, hardly occurs as compared with a case in which the supply of the liquid is started simultaneously from the supply ports disposed on the both sides of the projection area. Therefore, the remaining of the bubble in the liquid immersion area is suppressed. Further, the liquid immersion area can be filled with the liquid more quickly and reliably. As a result, it is unnecessary to perform any process for removing the bubble or the like. Further, it is possible to improve the throughput by shortening the period of time required for the liquid immersion area between the projection optical system and the substrate to be filled with the liquid.

According to a third aspect of the present invention, there is provided an exposure apparatus which exposes a substrate by projecting an image of a pattern through a liquid onto the substrate, the exposure apparatus comprising:

a projection optical system which projects the image of the pattern onto the substrate;

a liquid supply mechanism which has supply ports for supply of the liquid; and a substrate-moving unit which moves the substrate, wherein:

the supply of the liquid by the liquid supply mechanism is started while moving the substrate by the substrate-moving unit.

According to a fourth aspect of the present invention, there is provided an exposure method for exposing a substrate by projecting an image of a pattern through a liquid onto the substrate, the exposure method comprising:

starting supply of the liquid to a projection area onto which the image of the pattern is to be projected while moving the substrate before performing exposure operation; and exposing the substrate by projecting the image of the pattern onto the substrate through the supplied liquid.

According to the third and fourth aspects of the present invention, the supply of the liquid is started from the supply ports of the liquid supply mechanism while moving the substrate to form the liquid immersion area. Accordingly, it is possible to quickly form the liquid immersion area while suppressing the formation of any bubble or the like. In particular, the period of time, which is required to sufficiently fill the space between the projection optical system and the substrate with the liquid, can be shortened, and the throughput can be improved as compared with a case in which the liquid is supplied in a state in which the substrate is allowed to stand still when the liquid immersion area is formed. Further, the space between the projection optical system and the substrate can be filled with the liquid more reliably.

According to a fifth aspect of the present invention, there is provided an exposure apparatus which exposes a substrate by projecting an image of a pattern through a liquid onto the substrate, the exposure apparatus comprising:

a projection optical system which projects the image of the pattern onto the substrate; and a liquid supply mechanism which has supply ports for supply of the liquid on both sides of a projection area respectively and which supplies the liquid from the supply ports, the image of the pattern being projected onto the projection area by the projection optical system, wherein:

the liquid supply mechanism supplies the liquid in different amounts respectively from the supply ports disposed on the both sides when the liquid supply mechanism starts the supply of the liquid.

According to a sixth aspect of the present invention, there is provided an exposure method for exposing a substrate by projecting an image of a pattern through a liquid onto the substrate, the exposure method comprising:

starting supply of the liquid in different amounts respectively from both sides of a projection area onto which the image of the pattern is to be projected, before performing exposure operation; and exposing the substrate by projecting the image of the pattern onto the substrate through the supplied liquid.

According to the fifth and sixth aspects of the present invention, the period of time, which is required to sufficiently fill the space between the projection optical system and the substrate with the liquid, can be shortened, and the throughput can be improved. Further, the space between the projection optical system and the substrate can be filled with the liquid more reliably while suppressing the remaining of the bubble.

According to a seventh aspect of the present invention, there is provided an exposure apparatus which exposes a substrate by projecting an image of a pattern through a liquid onto the substrate, the exposure apparatus comprising:

a projection optical system which projects the image of the pattern onto the substrate; and a liquid supply mechanism which has supply ports for supply of the liquid on first and second sides of a projection area respectively and which supplies the liquid from the supply ports, the image of the pattern being projected onto the projection area by the projection optical system system, wherein:

the liquid supply mechanism supplies the liquid from the supply port disposed on the first side when the liquid supply mechanism starts the supply of the liquid.

According to the seventh aspect of the present invention, the period of time, which is required to sufficiently fill the space between the projection optical system and the substrate with the liquid, can be shortened, and the throughput can be improved. Further, the space between the projection optical system and the substrate can be filled with the liquid more reliably while suppressing the remaining of the bubble.

According to an eighth aspect of the present invention, there is provided an exposure apparatus which exposes a substrate by projecting an image of a pattern through a liquid onto the substrate, the exposure apparatus comprising:

a projection optical system which projects the image of the pattern onto the substrate; and a liquid supply mechanism which has supply ports for supply of the liquid on first and second sides of a projection area respectively and which supplies the liquid from the supply ports, the image of the pattern being projected onto the projection area by the projection optical system, wherein:

the liquid supply mechanism supplies the liquid in different amounts respectively from the supply port on the first side and the supply port on the second side when the liquid supply mechanism starts the supply of the liquid.

According to the eighth aspect of the present invention, the period of time, which is required to sufficiently fill the space between the projection optical system and the substrate with the liquid, can be shortened, and the throughput can be improved. Further, the space between the projection optical system and the substrate can be filled with the liquid more reliably while suppressing the remaining of the bubble.

According to a ninth aspect of the present invention, there is provided an exposure method for exposing a substrate by projecting an image of a pattern through a liquid onto the substrate with a projection optical system, the exposure method comprising:

starting supply of the liquid to a projection area onto which the image of the pattern is to be projected, while moving an object arranged on an image plane side of the projection optical system before performing exposure operation; and exposing the substrate by projecting the image of the pattern onto the substrate through the liquid between the projection optical system and the substrate.

According to the ninth aspect of the present invention, the period of time, which is required to sufficiently fill the optical path space disposed on the image plane side of the projection optical system with the liquid, can be shortened, and the throughput can be improved. Further, the space between the projection optical system and the substrate can be filled with the liquid more reliably while suppressing the remaining of the bubble.

According to a tenth aspect of the present invention, there is provided a method for producing a device, comprising using the exposure apparatus according to any one of the aspects described above. According to the present invention, the throughput can be improved, and it is possible to provide the device having the pattern formed with the satisfactory pattern accuracy.

DESCRIPTION OF THE PREFERRED EMBODIMENTS OF THE INVENTION

An explanation will be made below about an embodiment of the exposure apparatus according to the present invention with reference to the drawings. However, the present invention is not limited thereto.

Figure 1:
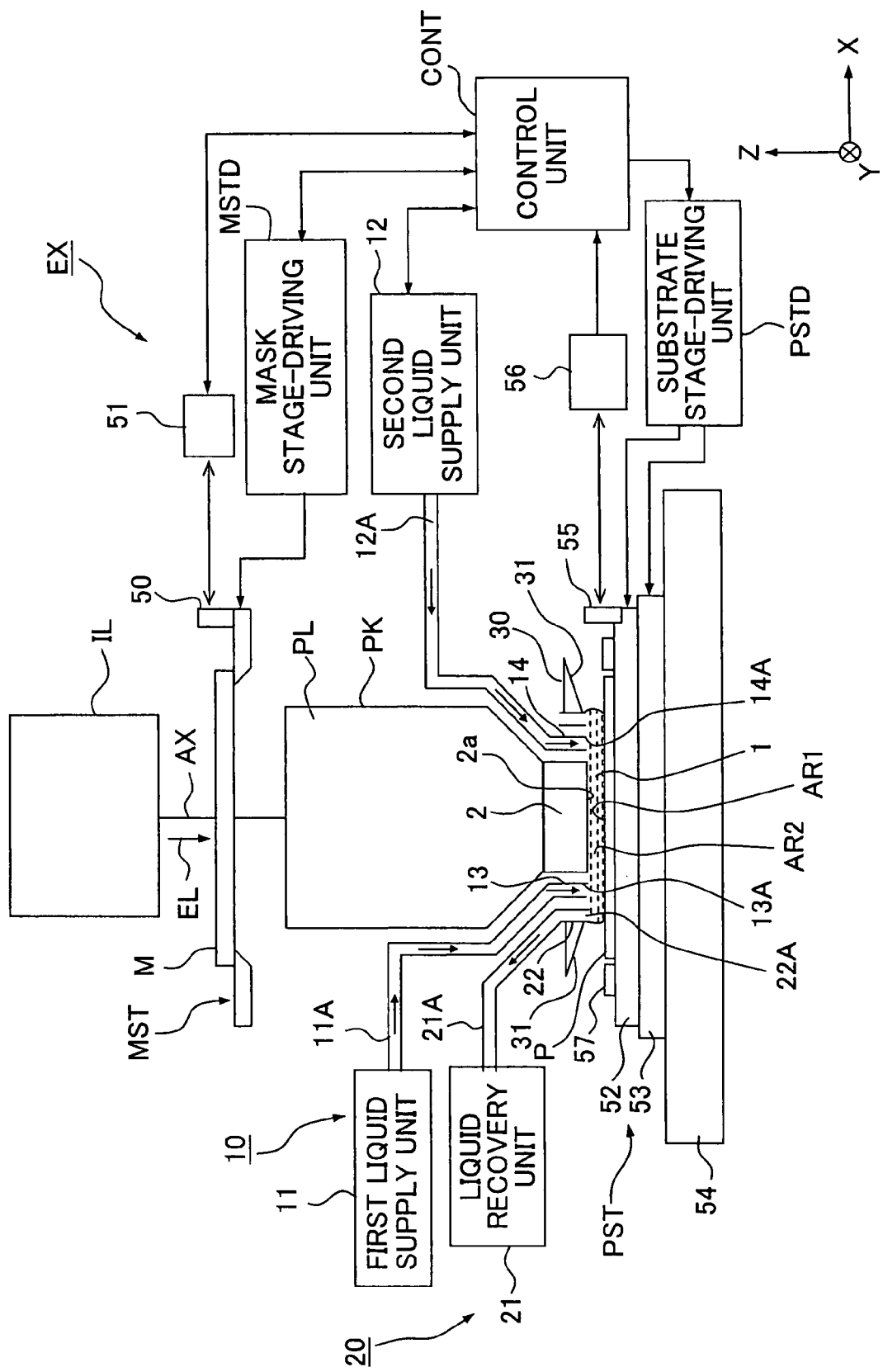
FIG. 1 shows a schematic arrangement illustrating an embodiment of an exposure apparatus of the present invention.

FIG. 1 shows a schematic arrangement illustrating an embodiment of the exposure apparatus of the present invention. With reference to FIG. 1, an exposure apparatus EX includes a mask stage MST which supports a mask M, a substrate stage PST which supports a substrate P, an illumination optical system IL which illuminates, with an exposure light beam EL, the mask M supported by the mask stage MST, a projection optical system PL which performs projection exposure for the substrate P supported by the substrate stage PST with an image of a pattern of the mask M illuminated with the exposure light beam EL, and a control unit CONT which collectively controls the overall operation of the exposure apparatus EX.

The exposure apparatus EX of this embodiment is a liquid immersion exposure apparatus to which the liquid immersion method is applied in order that the exposure wavelength is substantially shortened to improve the resolution and the depth of focus is substantially widened. The exposure apparatus EX includes a liquid supply mechanism 10 which supplies the liquid 1 onto the substrate P, and a liquid recovery mechanism 20 which recovers the liquid 1 from the substrate P. The exposure apparatus EX forms a liquid immersion area AR2 on a part of the substrate P including a projection area AR1 of the projection optical system PL by the liquid 1 supplied from the liquid supply mechanism 10 at least during the period in which the pattern image of the mask M is transferred onto the substrate P. Specifically, the exposure apparatus EX is operated as follows. That is, the space between the surface of the substrate P and the optical element 2 disposed at the end portion of the projection optical system PL is filled with the liquid 1. The pattern image of the mask M is projected onto the substrate P to expose the substrate P therewith via the projection optical system PL and the liquid 1 disposed between the projection optical system PL and the substrate P.

The embodiment of the present invention will now be explained as exemplified by a case using the scanning type exposure apparatus (so-called scanning stepper) as the exposure apparatus EX in which the substrate P is exposed with the pattern formed on the mask M while synchronously moving the mask M and the substrate P in mutually different directions (opposite directions) in the scanning directions. In the following explanation, the Z axis direction is the direction which is coincident with the optical axis AX of the projection optical system PL, the X axis direction is the synchronous movement direction (scanning direction) for the mask M and the substrate P in the plane perpendicular to the Z axis direction, and the Y axis direction is the direction (non-scanning direction) perpendicular to the Z axis direction and the X axis direction. The directions of rotation (inclination) about the X axis, the Y axis, and the Z axis are designated as θX, θY, and θZ directions respectively. The term "substrate" referred to herein includes those obtained by coating a semiconductor wafer surface with a photoresist as a photosensitive material, and the term "mask" includes a reticle formed with a device pattern to be subjected to the reduction projection onto the substrate.

The illumination optical system IL is used so that the mask M, which is supported on the mask stage MST, is illuminated with the exposure light beam EL. The illumination optical system IL includes, for example, an exposure light source, an optical integrator which uniformizes the illuminance of the light flux radiated from the exposure light source, a condenser lens which collects the exposure light beam EL supplied from the optical integrator, a relay lens system, and a variable field diaphragm which sets the illumination area on the mask M illuminated with the exposure light beam EL to be slit-shaped. The predetermined illumination area on the mask M is illuminated with the exposure light beam EL having a uniform illuminance distribution by the illumination optical system IL. Those usable as the exposure light beam EL radiated from the illumination optical system IL include, for example, emission lines (g-ray, h-ray, i-ray) in the ultraviolet region radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used.

The mask stage MST supports the mask M. The mask stage MST is two-dimensionally movable in the plane perpendicular to the optical axis AX of the projection optical system PL, i.e., in the XY plane, and it is finely rotatable in the θZ direction. The mask stage MST is driven by a mask stage-driving unit MSTD such as a linear motor. The mask stage-driving unit MSTD is controlled by the control unit CONT. A movement mirror 50 is provided on the mask stage MST. A laser interferometer 51 is provided at a position opposed to the movement mirror 50. The position in the two-dimensional direction and the angle of rotation of the mask M on the mask stage MST are measured in real-time by the laser interferometer 51. The result of the measurement is outputted to the control unit CONT. The control unit CONT drives the mask stage-driving unit MSTD on the basis of the result of the measurement obtained by the laser interferometer 51 to thereby position the mask M supported on the mask stage MST.

The projection optical system PL projects the pattern on the mask M onto the substrate P at a predetermined projection magnification β to perform the exposure. The projection optical system PL includes a plurality of optical elements including the optical element (lens) 2 provided at the end portion on the side of the substrate P. The optical elements are supported by a barrel PK. In this embodiment, the projection optical system PL is the reduction system having the projection magnification β which is, for example, ¼ or ⅕. The projection optical system PL may be any one of the 1× magnification system and the magnifying system. The optical element 2, which is disposed at the end portion of the projection optical system PL of this embodiment, is provided detachably (exchangeably) with respect to the barrel PK. The liquid 1 in the liquid immersion area AR2 makes contact with the optical element 2.

The optical element 2 is formed of fluorite. Fluorite has a high affinity for water. Therefore, the liquid 1 is successfully allowed to make tight contact with the substantially entire surface of the liquid contact surface 2a of the optical element 2. That is, in this embodiment, the liquid (water) 1, which has the high affinity for the liquid contact surface 2a of the optical element 2, is supplied. Therefore, the highly tight contact is effected between the liquid 1 and the liquid contact surface 2a of the optical element 2. The optical path between the optical element 2 and the substrate P can be reliably filled with the liquid 1. The optical element 2 may be formed of quartz having a high affinity for water. A water-attracting (lyophilic or liquid-attracting) treatment may be applied to the liquid contact surface 2a of the optical element 2 to further enhance the affinity for the liquid 1.

The substrate stage PST supports the substrate P. The substrate stage PST includes a Z stage 52 which holds the substrate P by the aid of a substrate holder, an XY stage 53 which supports the Z stage 52, and a base 54 which supports the XY stage 53. The substrate stage PST is driven by a substrate stage-driving unit PSTD such as a linear motor. The substrate stage-driving unit PSTD is controlled by the control unit CONT. When the Z stage 52 is driven, the substrate P, which is held on the Z stage 52, is subjected to the control of the position (focus position) in the Z axis direction and the positions in the θX and θY directions. When the XY stage 53 is driven, the substrate P is subjected to the control of the position in the XY directions (position in the directions substantially parallel to the image plane of the projection optical system PL). That is, the Z stage 52 controls the focus position and the angle of inclination of the substrate P so that the surface of the substrate P is adjusted to match the image plane of the projection optical system PL in the auto-focus manner and the auto-leveling manner. The XY stage 53 positions the substrate P in the X axis direction and the Y axis direction. It goes without saying that the Z stage and the XY stage may be provided in an integrated manner.

A movement mirror 55, which is movable together with the substrate stage PST with respect to the projection optical system PL, is provided on the substrate stage PST (Z stage 52). A laser interferometer 56 is provided at a position opposed to the movement mirror 55. The angle of rotation and the position in the two-dimensional direction of the substrate P on the substrate stage PST are measured in real-time by the laser interferometer 56. The result of the measurement is outputted to the control unit CONT. The control unit CONT drives the substrate stage-driving unit PSTD on the basis of the result of the measurement of the laser interferometer 56 to thereby position the substrate P supported on the substrate stage PST.

An auxiliary plate 57 is provided on the substrate stage PST (Z stage 52) so that the substrate P is surrounded thereby. The auxiliary plate 57 has a flat surface which has approximately the same height as that of the surface of the substrate P held by the substrate holder. In this arrangement, a gap of about 0.1 to 2 mm is provided between the auxiliary plate 57 and the edge of the substrate P. However, the liquid 1 scarcely flows into the gap owing to the surface tension of the liquid 1. Even when the vicinity of the circumferential edge of the substrate P is subjected to the exposure, the liquid 1 can be retained under the projection optical system PL by the aid of the auxiliary plate 57.

The liquid supply mechanism 10 supplies the predetermined liquid 1 onto the substrate P. The liquid supply mechanism 10 includes a first liquid supply unit 11 and a second liquid supply unit 12 which are capable of supplying the liquid 1, a first supply member 13 which is connected to the first liquid supply unit 11 through a supply tube 11A having a flow passage and which has a supply port 13A for supplying, onto the substrate P, the liquid 1 fed from the first liquid supply unit 11, and a second supply member 14 which is connected to the second liquid supply unit 12 through a supply tube 12A having a flow passage and which has a supply port 14A for supplying, onto the substrate P, the liquid 1 fed from the second liquid supply unit 12. The first and second supply members 13, 14 are arranged closely to the surface of the substrate P, and they are provided at positions which are different from each other in the surface direction of the substrate P. Specifically, the first supply member 13 of the liquid supply mechanism 10 is provided on one side (−X side) in the scanning direction with respect to the projection area AR1, and the second supply member 14 is provided on the other side (+X side).

Each of the first and second liquid supply units 11, 12 includes, for example, a tank for accommodating the liquid 1, and a pressurizing pump. The first and second liquid supply units 11, 12 supply the liquid 1 from the positions over the substrate P through the supply tubes 11A, 12A and the supply members 13, 14 respectively. The operation of the first and second liquid supply units 11, 12 for supplying the liquid is controlled by the control unit CONT. The control unit CONT is capable of controlling the liquid supply amounts per unit time onto the substrate P by the first and second liquid supply units 11, 12 independently respectively.

In this embodiment, pure water is used as the liquid 1. Those capable of being transmitted through pure water include the ArF excimer laser beam as well as the emission line (g-ray, h-ray, i-ray) in the ultraviolet region radiated, for example, from a mercury lamp and the far ultraviolet light beam (DUV light beam) such as the KrF excimer laser beam (wavelength: 248 nm).

The liquid recovery mechanism 20 recovers the liquid 1 from the surface of the substrate P. The liquid recovery mechanism 20 includes a recovery member 22 which has a recovery port 22A arranged closely to the surface of the substrate P, and a liquid recovery unit 21 which is connected to the recovery member 22 through a recovery tube 21A having a flow passage. The liquid recovery unit 21 includes, for example, a sucking unit such as a vacuum pump, and a tank for accommodating the recovered liquid 1, and the like. The liquid recovery unit 21 recovers the liquid 1 from the surface of the substrate P via the recovery member 22 and the recovery tube 21A. The operation of the liquid recovery unit 21 for recovering the liquid is controlled by the control unit CONT. The control unit CONT is capable of controlling the liquid recovery amount per unit time by the liquid recovery unit 21.

A trap member 30, which is formed with a liquid trap surface 31 having a predetermined length to capture the liquid 1, is arranged outside the recovery member 22 of the liquid recovery mechanism 20.

Figure 2:
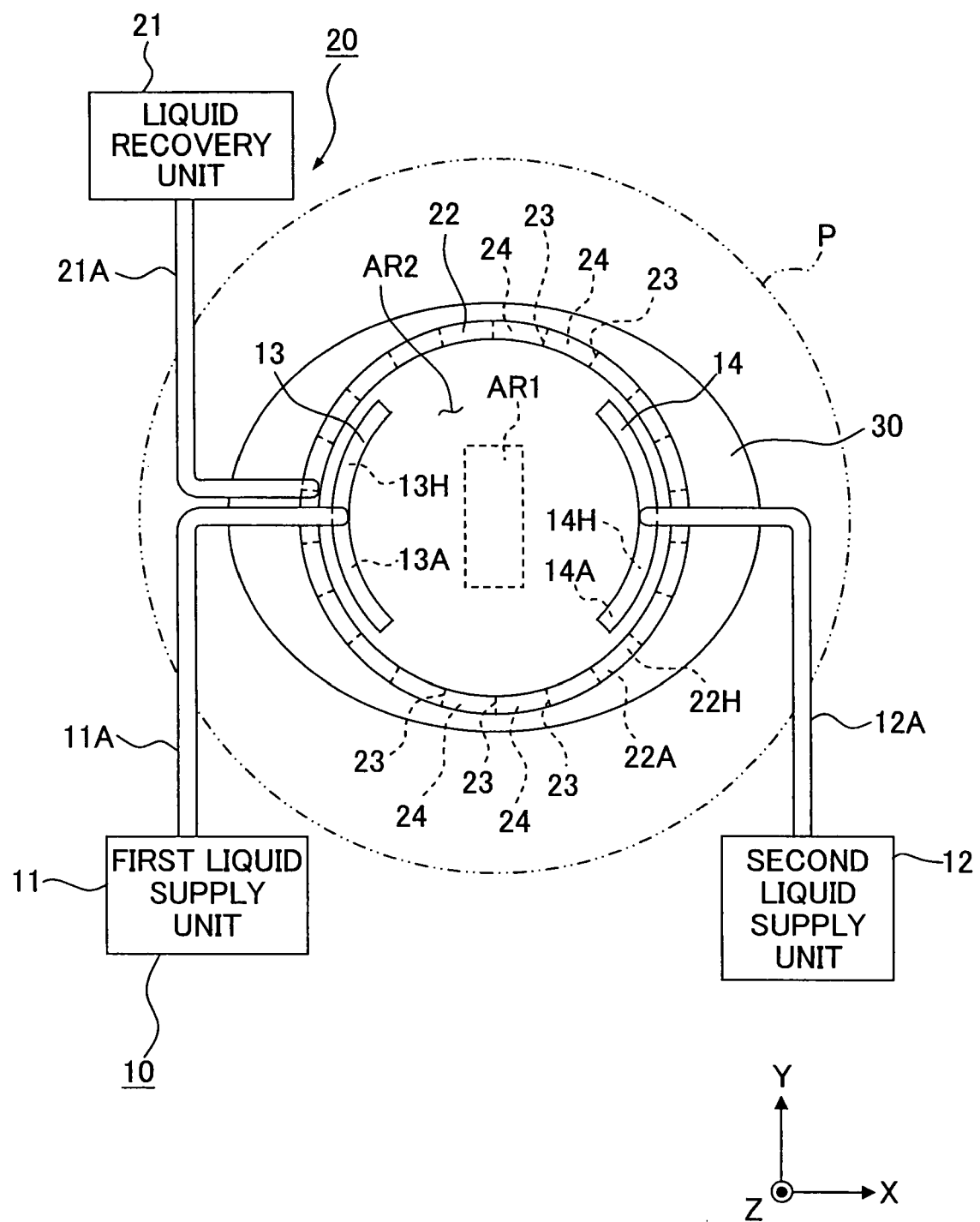
FIG. 2 shows a plan view illustrating a schematic arrangement of a liquid supply mechanism and a liquid recovery mechanism.

FIG. 2 shows a plan view illustrating a schematic arrangement of the liquid supply mechanism 10 and the liquid recovery mechanism 20. As shown in FIG. 2, the projection area AR1 of the projection optical system PL is designed to have a rectangular shape in which the Y axis direction (non-scanning direction) is the longitudinal direction. The liquid immersion area AR2, which is filled with the liquid 1, is formed on a part of the substrate P so that the projection area AR1 is covered thereby. The first supply member 13 of the liquid supply mechanism 10, which is used to form the liquid immersion area AR2 of the projection area AR1, is provided on one side (−X side) in the scanning direction with respect to the projection area AR1, and the second supply member 14 is provided on the other side (+X side).

The first and second supply members 13, 14 have internal spaces 13H, 14H for allowing the liquid 1 fed from the first and second liquid supply units 11, 12 to flow therethrough, and supply ports 13A, 14A for supplying, onto the substrate P, the liquid 1 having flown through the internal spaces 13H, 14H respectively. Each of the supply ports 13A, 14A of the first and second supply members 13, 14 is formed to have a substantially circular arc-shaped slit form as viewed in the plan view. The size of the supply port 13A, 14A in the Y axis direction is designed to be larger than at least the size of the projection area AR1 in the Y axis direction. The supply ports 13A, 14A, which are formed to be substantially circular arc-shaped as viewed in the plan view, are arranged to interpose the projection area AR1 in relation to the scanning direction (X direction). That is, the straight line, which connect the center of the projection area AR1 and the respective central portions of the supply ports 13A, 14A in the Y axis direction, is substantially parallel to the X axis direction. The liquid supply mechanism 10 is capable of simultaneously supplying the liquid 1 from the supply ports 13A, 14A on the both sides of the projection area AR1.

The recovery member 22 of the liquid recovery mechanism 20 is a dual-structured annular member having a recovery port 22A which is formed annularly and continuously so that the recovery port 22A is directed to the surface of the substrate P, and an annular internal space (internal flow passage) 22H which allows the liquid 1 recovered through the recovery port 22A to flow therethrough. The recovery member 22 of the liquid recovery mechanism 20 is arranged to surround the projection area AR1 and the supply members 13, 14 of the liquid recovery mechanism 10. Partition members 23, which divide the internal space 22H into a plurality of spaces (divided spaces) 24 in the circumferential direction, are provided at predetermined intervals in the recovery member 22.

The respective divided spaces 24, which are divided by the partition members 23, make penetration at upper portions. The lower end of the recovery member 22 having the recovery port 22A is disposed closely to the surface of the substrate P. On the other hand, the upper end is a collected space (manifold) for spatially collecting the plurality of divided spaces 24. One end of the recovery tube 21A is connected to the manifold, and the other end is connected to the liquid recovery unit 21. The liquid recovery mechanism 20 recovers the liquid 1 from the substrate P by the aid of the recovery port 22A (recovery member 22) and the recovery tube 21A by driving the liquid recovery unit 21. In this embodiment, the recovery port 22A of the liquid recovery mechanism 20 is substantially circular and annular as viewed in the plan view, which surrounds the supply ports 13A, 14A and the projection area AR1. The recovery member 22 is not limited to the circular annular member, and may be provided by combining, for example, circular arc-shaped members divided for the +X side and the −X side respectively.

Figure 3:
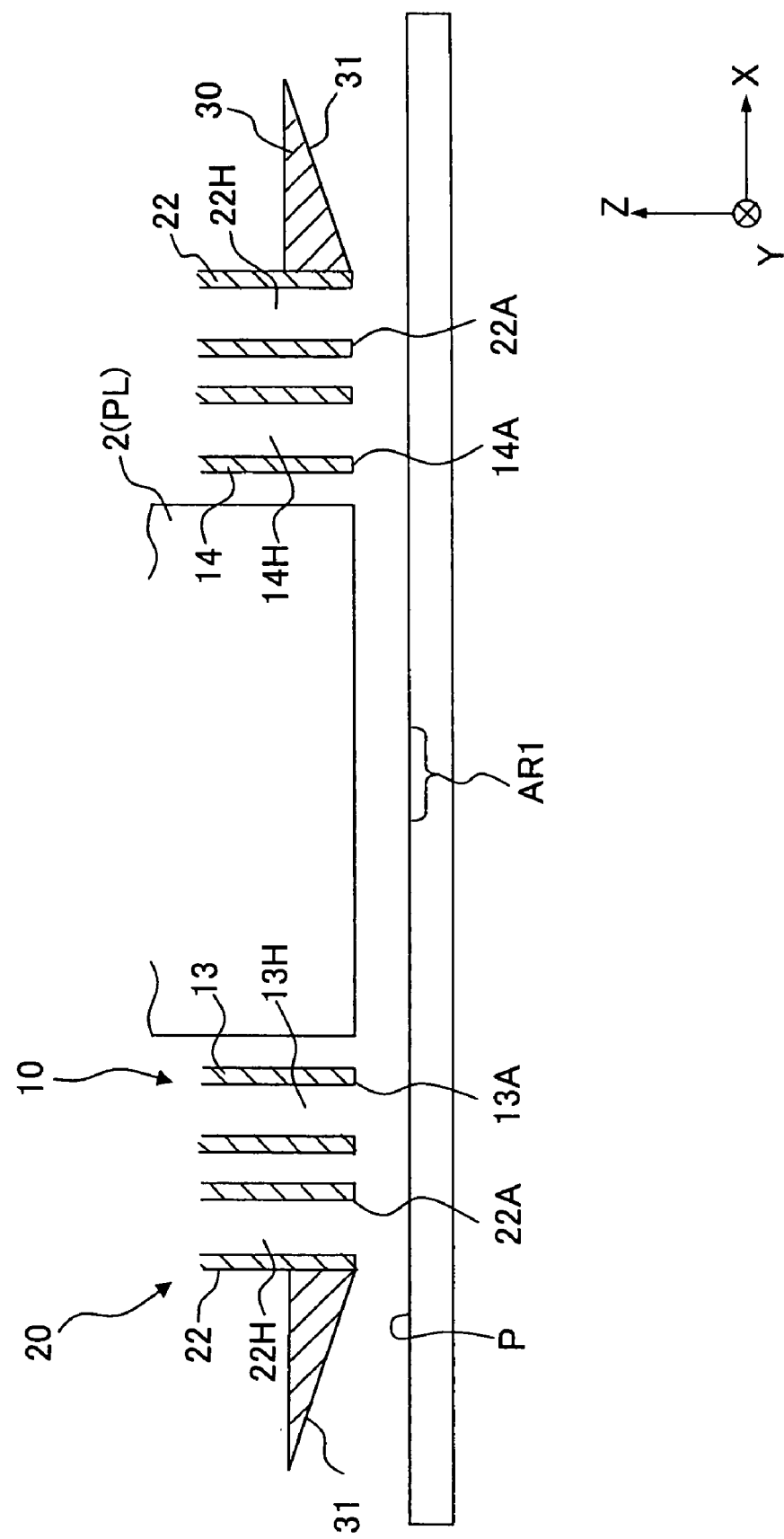
FIG. 3 shows a magnified sectional view illustrating major parts disposed in the vicinity of a supply port and a recovery port.

FIG. 3 shows a magnified side sectional view illustrating major parts to depict the first and second supply members 13, 14 and the recovery member 22 arranged closely to the substrate P. As shown in FIG. 3, the internal flow passages 13H, 14H of the first and second supply members 13, 14, respectively, are provided substantially perpendicularly to the surface of the substrate P. Similarly, the internal flow passage 22H of the recovery member 22 of the liquid recovery mechanism 20 is also provided substantially perpendicularly to the surface of the substrate P. The supply positions of the liquid 1 supplied by the first and second supply members 13, 14 to the substrate P (positions of installation of the supply ports 13A, 14A) are set between the liquid recovery position of the liquid recovery mechanism 20 (position of installation of the recovery port 22A) and the projection area AR1. In this embodiment, the positions (heights) in the Z axis direction are set to be identical for the supply ports 13A, 14A, the recovery port 22A, and the lower end surface of the projection optical system PL respectively.

In this embodiment, at least the members for allowing the liquid 1 to flow therein, which are included in the respective members for constructing the liquid supply mechanism 10 and the liquid recovery mechanism 20, are formed of, for example, synthetic resin such as polytetrafluoroethylene. Accordingly, it is possible to suppress the contamination of the liquid 1 with any impurity. Alternatively, the members may be formed of metal such as stainless steel. The flow passage surface may be coated with a material containing silver. Silver not only has the affinity for the liquid 1, but silver is also excellent in the antimicrobial property. It is possible to suppress the pollution (proliferation of microbes or the like) caused for the liquid 1 and the members disposed therearound. The member itself, in which the liquid 1 flows, may be formed of a material containing silver. When the member, in which the liquid 1 flows, is synthetic resin or the like, it is possible to adopt such an arrangement that silver (or silver fine particles) is embedded and arranged on the flow passage surface.

The trap member 30, which is formed with the liquid trap surface 31 having predetermined lengths to capture the liquid 1 unsuccessfully recovered by the recovery member 22 of the liquid recovery mechanism 20, is provided outside the recovery member 22 of the liquid recovery mechanism 20 in relation to the projection area AR1. The trap member 30 is attached to the outer side surface of the recovery member 22. The trap surface 31 is the surface (i.e., the lower surface) of the trap member 30 directed toward the substrate P. The trap surface 31 is inclined with respect to the horizontal plane as shown in FIG. 3. Specifically, the trap surface 31 is inclined to make separation from the surface of the substrate P (to be directed upwardly) at outer positions with respect to the projection area AR1 (liquid immersion area AR2). The trap member 30 is formed of, for example, metal such as stainless steel.

As shown in FIG. 2, the trap member 30 is an annular member as viewed in the plan view. The trap member 30 is connected to the outer side surface of the recovery member 22 so that the trap member 30 is fitted to the recovery member 22. In this embodiment, the trap member 30 and the trap surface 31 as the lower surface thereof are substantially elliptical as viewed in the plan view. The length of the trap surface 31 in the scanning direction (X axis direction) is longer than that in the non-scanning direction (Y axis direction).

A lyophilic or liquid-attracting treatment (water-attracting treatment) is applied to the trap surface 31 to enhance the affinity for the liquid 1. In this embodiment, the liquid 1 is water. Therefore, the surface treatment, which is in conformity with the affinity for water, is applied to the trap surface 31. The surface of the substrate P is coated with a water-repelling (with a contact angle of about 70 to 80°) photosensitive material (for example, TARF-P6100 produced by TOKYO OHKA KOGYO CO., LTD.) for the ArF excimer laser. The liquid affinity of the trap surface 31 for the liquid 1 is higher than the liquid affinity of the photosensitive material applied to the surface of the substrate P for the liquid 1. The surface treatment for the trap surface 31 is performed depending on the polarity of the liquid 1. In this embodiment, the liquid 1 is water having large polarity. Therefore, as for the liquid-attracting treatment for the trap surface 31, a thin film is formed with a substance such as alcohol having a molecular structure with large polarity. Accordingly, the liquid-attracting property or hydrophilicity is given to the trap surface 31. As described above, when water is used as the liquid 1, it is desirable to adopt such a treatment that a substance having the molecular structure with the large polarity such as the OH group is arranged on the trap surface 31. In this case, the thin film for the surface treatment is formed of a material which is insoluble in the liquid 1. The treatment condition of the liquid-attracting treatment is appropriately changed depending on the material characteristic of the liquid 1 to be used.

Next, an explanation will be made about a method for exposing the substrate P with the pattern image of the mask M by using the exposure apparatus EX described above.

Figure 7:
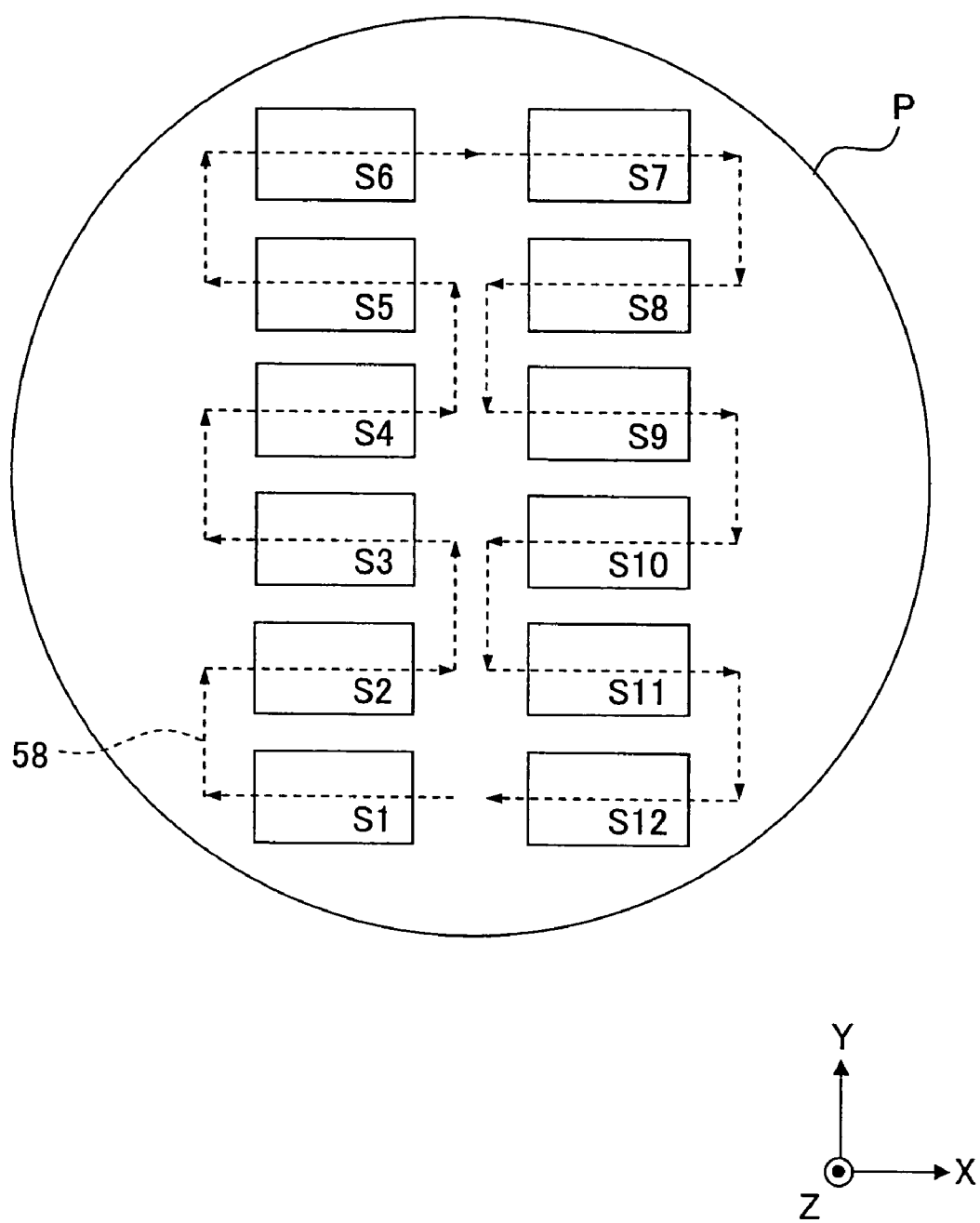
FIG. 7 shows shot areas set on a substrate.

With reference to FIG. 1 again, the exposure apparatus EX of this embodiment performs the projection exposure for the pattern image of the mask M onto the substrate P while moving the mask M and the substrate P in the X axis direction (scanning direction). During the scanning exposure, a part of the pattern image of the mask M is projected onto the rectangular projection area AR1 disposed just under the end portion of the projection optical system PL. The mask M is moved at the velocity V in the −X direction (or in the +X direction) with respect to the projection optical system PL, in synchronization with which the substrate P is moved at the velocity β·V (β represents the projection magnification) in the +X direction (or in the −X direction) by the aid of the XY stage 53. As shown in a plan view of FIG. 7, a plurality of shot areas S1 to S12 are set on the substrate P. After the exposure is completed for one shot area, the next shot area is moved to the scanning start position in accordance with the stepping movement of the substrate P. The scanning exposure process is successively performed thereafter for the respective shot areas while moving the substrate P in the step-and-scan manner. In this embodiment, the control unit CONT moves the XY stage 53 while monitoring the output of the laser interferometer 56 so that the optical axis AX of the projection optical system PL is advanced along broken line arrows 58 as shown in FIG. 7 in relation to the shot areas S1 to S12 on the substrate.

FIG. 3 shows a state brought about immediately after the substrate P is loaded on (imported to) the substrate stage PST. In order to form the liquid immersion area AR2 after loading the substrate P on the substrate stage PST, the control unit CONT starts the supply of the liquid 1 by the liquid supply mechanism 10 while moving the substrate P. In this situation, the control unit CONT also starts the driving of the liquid recovery mechanism 20. The control unit CONT starts the movement of the substrate P by the aid of the substrate stage PST, and then the control unit CONT starts the supply of the liquid 1 with only one supply port of the supply ports 13A, 14A provided on the both sides of the projection area AR1 of the projection optical system PL. In this procedure, the control unit CONT controls the operation for supplying the liquid by the first and second liquid supply units 11, 12 of the liquid supply mechanism 10 to supply the liquid 1 from the portion disposed at a position approaching the projection area AR1 in relation to the scanning direction.

Figure 4:
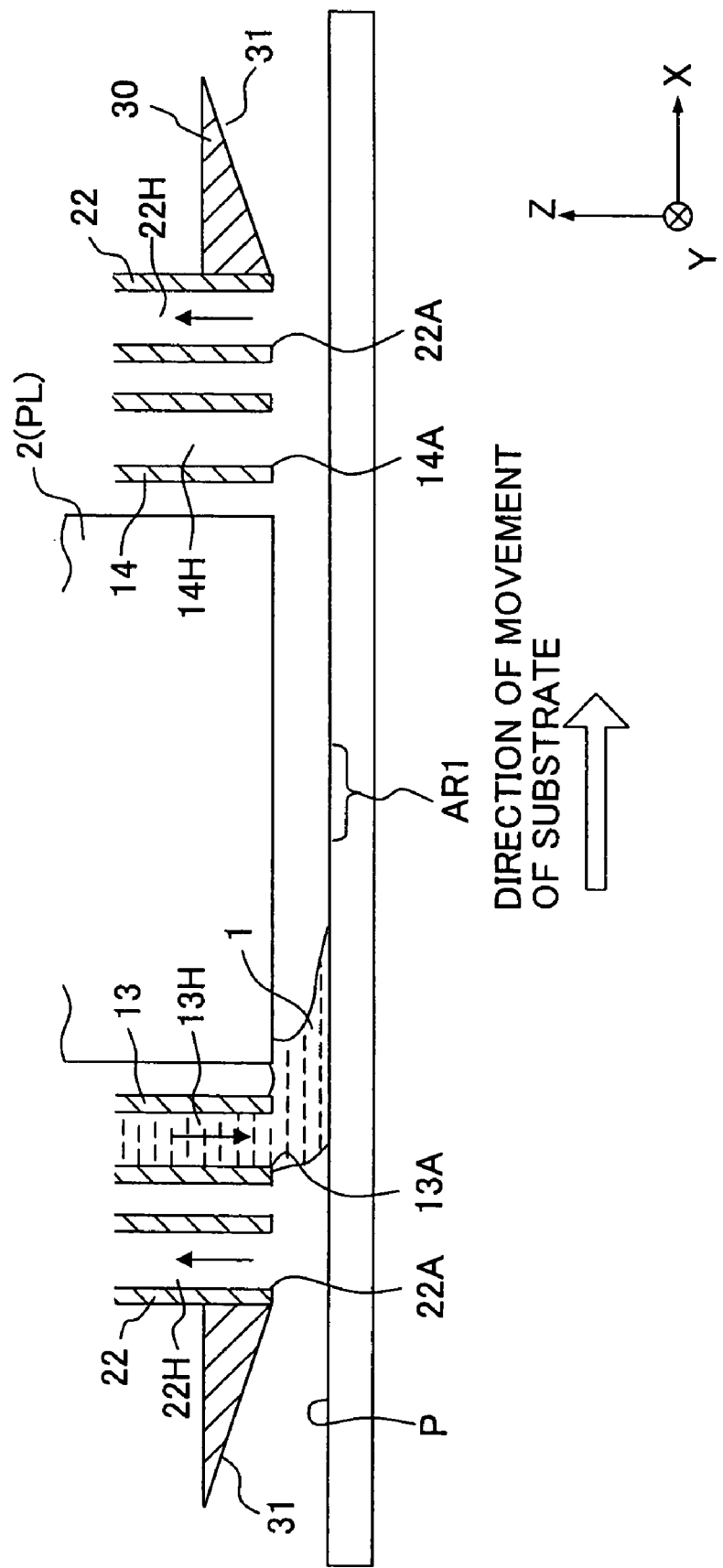
FIG. 4 schematically illustrates the behavior of the liquid.

FIG. 4 schematically shows a state brought about immediately after starting the supply of the liquid 1. As shown in FIG. 4, the substrate P is moved in the +X direction in this embodiment, and the supply of the liquid 1 is started from only the supply port 13A. In this procedure, the timing, at which the supply of the liquid 1 is started from the supply port 13A, may be any one of those during the accelerating movement of the substrate P, and during the movement at a constant velocity, after the start of the movement of the substrate P. The control unit CONT effects the supply of the liquid 1 onto the substrate P in a state in which the liquid supply amount per unit time from the supply port 13A is approximately constant while moving the substrate P at approximately the constant velocity movement and at a predetermined speed. The liquid 1, which is supplied from the supply port 13A arranged on the −X side with respect to the projection area AR1, i.e., from the supply port 13A arranged at the rearward position in the direction of movement of the substrate, is quickly arranged between the projection optical system PL and the substrate P such that the liquid 1 is pulled by the substrate P allowed to move in the +X direction.

Figure 5:
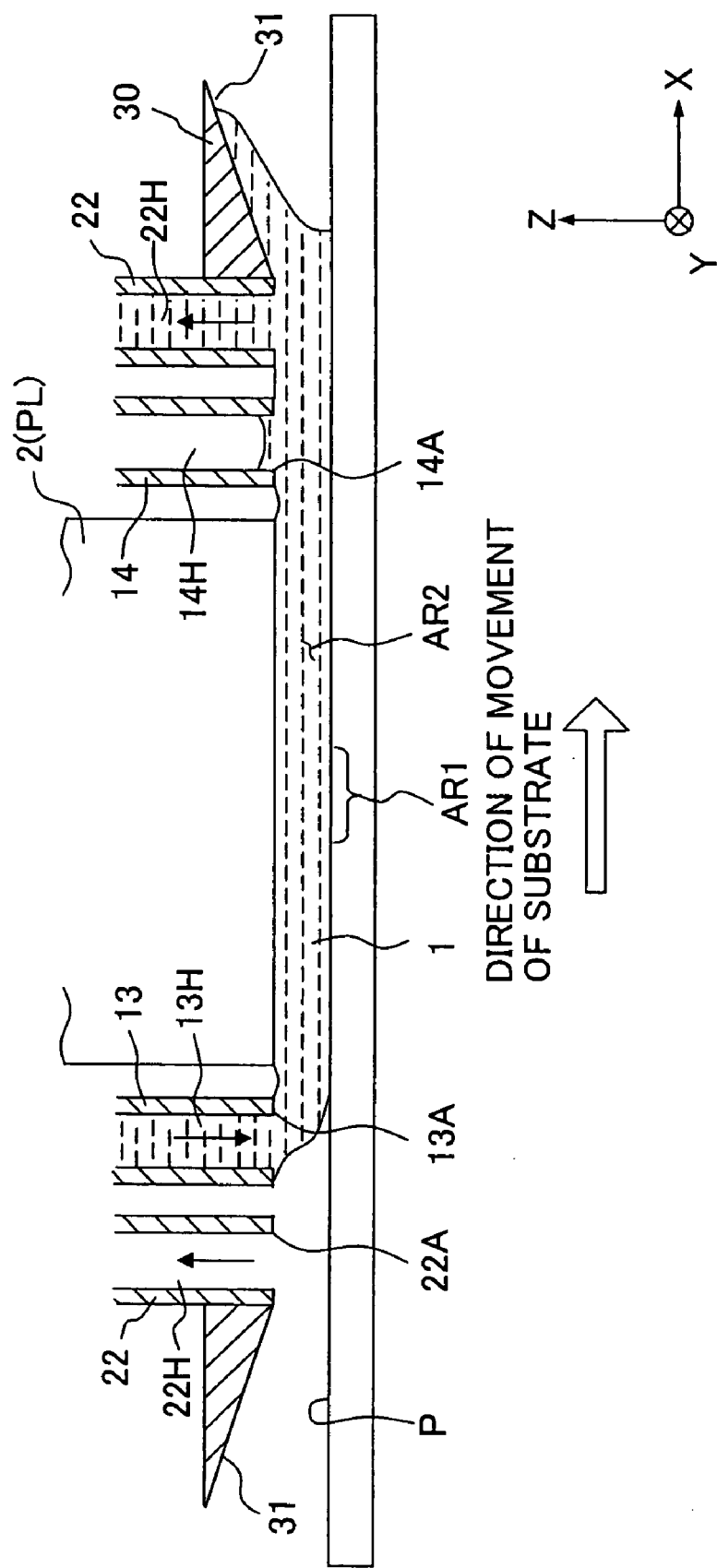
FIG. 5 schematically illustrates the behavior of the liquid.

FIG. 5 schematically shows a state in which the space between the projection optical system PL and the substrate P is filled with the liquid 1. As shown in FIG. 5, the liquid 1, which is supplied from the supply port 13A, is smoothly arranged between the projection optical system PL and the substrate P. In this situation, only the gas (air) is recovered from the area disposed on the −X side of the recovery port 22A of the liquid recovery mechanism 20, and the liquid (or the gas and the liquid) is recovered from the area disposed on the +X side.

When the substrate P is moved in the +X direction, then the amount of the liquid allowed to move toward the +X side with respect to the projection area AR2 is increased, and all of the liquid 1 cannot be recovered in some cases in the area disposed on the +X side of the recovery port 22A. However, the liquid 1, which is unsuccessfully recovered by the recovery port 22A disposed on the +X side, is captured by the trap surface 31 of the trap member 30 which is provided on the +X side from the liquid recovery position (on the outer side with respect to the projection area AR1). Therefore, the liquid 1 is neither allowed to outflow nor scattered, for example, to the surroundings of the substrate P. Further, the liquid 1 is not supplied from the supply port 14A disposed on the +X side.

Therefore, the amount of the liquid allowed to flow to the recovery port 22A on the +X side is reduced. Therefore, it is possible to suppress the occurrence of any inconvenience which would be otherwise caused such that the liquid 1 cannot be recovered by the recovery port 22A and the liquid 1 flows out.

After the liquid immersion area AR2 is formed by the supply of the liquid from one supply port 13A, the control unit CONT starts the supply of the liquid 1 from the supply ports 13A, 14A disposed on the both sides. After that, the control unit CONT starts the exposure process for the respective shot areas S1 to S12 on the substrate P.

In the exposure process, the control unit CONT drives the first and second liquid supply units 11, 12 of the liquid supply mechanism 10 respectively to simultaneously supply the liquid 1 from the supply ports 13A 14A onto the substrate P. The liquid 1, which is supplied from the supply ports 13A, 14A onto the substrate P, forms the liquid immersion area AR2 which has a range wider than that of the projection area AR1.

During the exposure process, the control unit CONT controls the operation of the first and second liquid supply units 11, 12 of the liquid supply mechanism 10 to supply the liquid so that the supply amount per unit time of the liquid supplied from the position approaching the projection area AR1 in relation to the scanning direction is set to be larger than the supply amount of the liquid supplied from the position on the opposite side (position leaving or separating away from the projection area AR in relation to the scanning direction). For example, when the exposure process is performed while moving the substrate P in the +X direction, the control unit CONT is operated such that the amount of the liquid supplied from the −X side with respect to the projection area AR1 (i.e., from the supply port 13A which corresponds to the position approaching the projection area AR1 in relation to the scanning direction) is larger than the amount of the liquid supplied from the +X side (i.e., from the supply port 14A which corresponds to the position leaving the projection area AR1 in relation to the scanning direction). On the other hand, when the exposure process is performed while moving the substrate P in the −X direction, the amount of the liquid supplied from the +X side with respect to the projection area AR1 is larger than the amount of the liquid supplied from the −X side. The amount of the liquid to be supplied from the supply port 13A onto the substrate P when substrate P is moving in the +X direction may be set to be approximately identical with the amount of the liquid to be supplied from the supply port 14A onto the substrate P when the substrate P is moving in the −X direction. Further, the amount of the liquid to be supplied from the supply port 14A onto the substrate P when substrate P is moving in the +X direction may be set to be approximately identical with the amount of the liquid to be supplied from the supply port 13A onto the substrate when substrate P is moving in the −X direction.

The control unit CONT drives the liquid recovery unit 21 of the liquid recovery mechanism 20 to perform the operation to recover the liquid from the substrate P concurrent with the operation to supply the liquid 1 by the liquid supply mechanism 10. Accordingly, the liquid 1 on the substrate P, which flows to the outside of the supply ports 13A, 14A with respect to the projection area AR1, is recovered from the recovery port 22A. The liquid 1, which has been recovered from the recovery port 22A, passes through the recovery tube 21A, and the liquid 1 is recovered by the liquid recovery unit 21. The control unit CONT performs the projection exposure of the pattern image of the mask M onto the substrate P via the projection optical system PL and the liquid 1 disposed between the projection optical system PL and the substrate P while moving the substrate stage PST for supporting the substrate P in the X axis direction (scanning direction). During this process, the liquid supply mechanism 10 simultaneously supplies the liquid 1 by the aid of the supply ports 13A, 14A from the both sides of the projection area AR1 in relation to the scanning direction. Therefore, the liquid immersion area AR2 is formed uniformly and satisfactorily. Even when the scanning direction of the substrate P is alternately switched into the +X direction and the −X direction, it is possible to continue the supply from the supply ports 13A, 14A.

When the first shot area S1 on the substrate P is subjected to the exposure, the substrate P is moved in the +X direction. When the substrate P is moved in the +X direction, then the amount of the liquid moved toward the +X side with respect to the projection area AR1 is increased, and the recovery port 22A, which has the liquid recovery position disposed on the +X side, cannot recover all of the liquid 1 in some cases. However, the liquid 1, which is unsuccessfully recovered by the recovery port 22A on the +X side, is captured by the trap surface 31 of the trap member 30 provided on the +X side with respect to the liquid recovery position. Therefore, the liquid 1 does not cause the scattering and the outflow, for example, to the surroundings of the substrate P. In this embodiment, the trap surface 31 is subjected to the liquid-attracting treatment for the liquid 1, and the trap surface 31 has the affinity for the liquid higher than that of the surface of the substrate P. Therefore, the liquid 1, which intends to outflow to the outside of the liquid recovery position of the recovery port 22A, is not pulled toward the substrate P but is pulled toward the trap surface 31. Accordingly, the occurrence of any inconvenience is suppressed, which would be otherwise caused, for example, such that the liquid 1 remains on the substrate P.

When the exposure process is completed for the first shot area, the control unit CONT causes the stepping movement of the substrate P in order that the projection area AR1 of the projection optical system PL is arranged on the second shot area which is different from the first shot area. Specifically, the control unit CONT causes the stepping movement in the Y axis direction between the two shot areas S1, S2 on the substrate P, for example, in order to perform the scanning exposure process for the shot area S2 after the completion of the scanning exposure process for the shot area S1. The control unit CONT also continues the operation to supply the liquid onto the substrate P by the liquid supply mechanism 10 during the stepping movement. The exposure is performed for the shot area S2 while moving the substrate P in the −X direction. Subsequently, the exposure process is successively performed for the plurality of shot areas S3 to S12 respectively.

Figure 6:
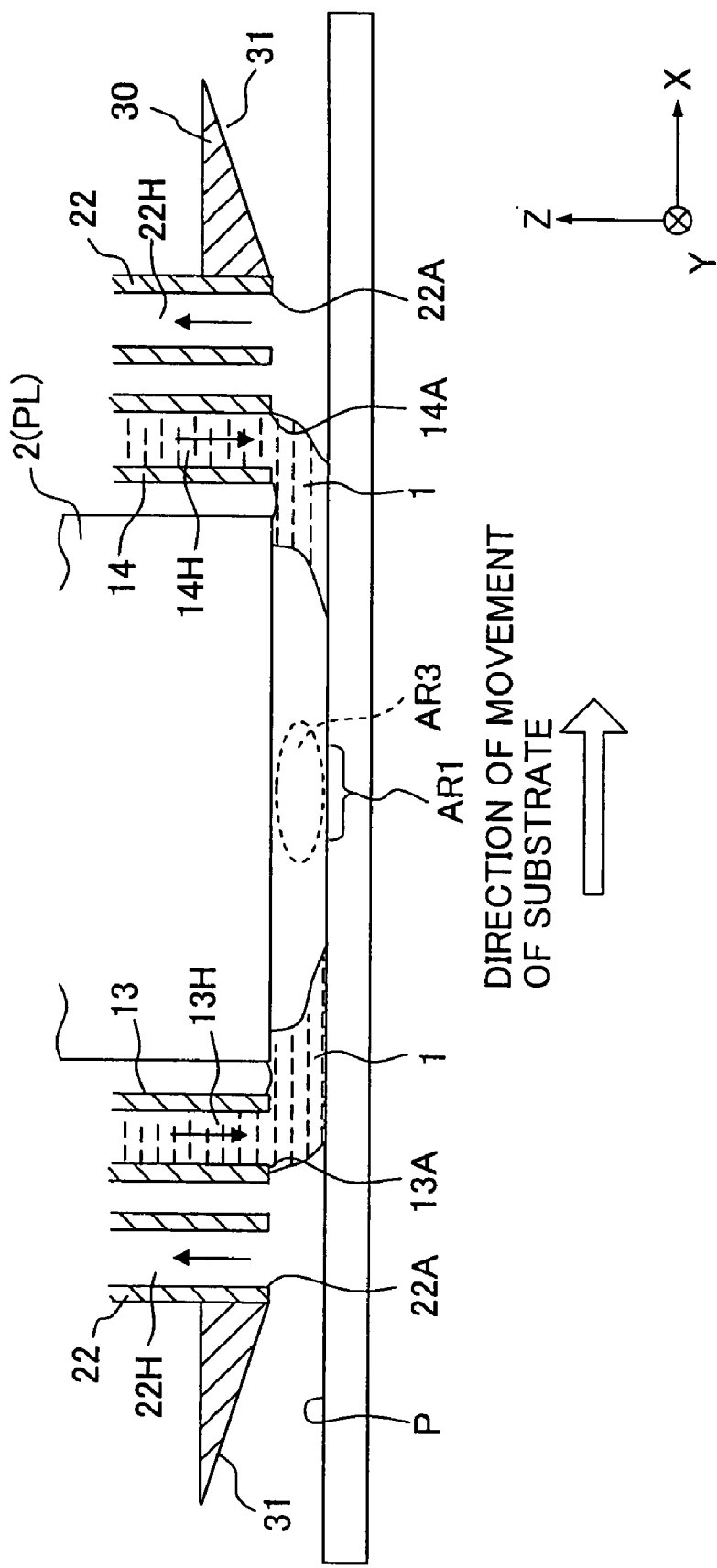
FIG. 6 schematically illustrates the behavior of the liquid.

As explained above, the liquid immersion area AR2 is formed by starting the supply of the liquid 1 from only one supply port 13A of the supply ports 13A, 14A arranged on the both sides of the projection area AR1, after loading the substrate P on the substrate stage PST. Accordingly, it is possible to quickly form the liquid immersion area AR2 while suppressing the formation of any bubble or the like. As schematically shown in FIG. 6, it is also conceived that the supply of the liquid 1 is started simultaneously from the supply ports 13A, 14A disposed on the both sides in a state in which the substrate P is allowed to stand still. However, in this case, the following possibility arises. That is, the flows of the liquid, which are supplied from the supply ports 13A, 14A disposed on the both sides, make collision or interference with each other. For example, the central portion AR3, which is included in the area intended or expected to undergo the formation of the liquid immersion area, is not filled with the liquid 1, and/or any bubble or the like is formed. However, when the supply of the liquid 1 is started from only the supply port 13A, it is possible to form the liquid immersion area AR2 quickly and smoothly.

In the embodiment described above, the movement of the substrate P is started before starting the supply of the liquid 1 from the supply port 13A onto the substrate P. However, it is also allowable that the movement of the substrate P is started after the elapse of a predetermined period of time after the start of the supply of the liquid 1 or substantially simultaneously with the start of the supply or the liquid 1. Also in this procedure, it is possible to form the liquid immersion area AR2 quickly and smoothly.

When the liquid 1 is supplied from only one of the supply ports 13A, 14A disposed on the both sides, the liquid 1 may be supplied in a state in which the substrate P is allowed to stand still. There is such a possibility that a certain period of time is required until the formation of the liquid immersion area AR2 is completed as compared with the case in which the liquid 1 is supplied while moving the substrate P. However, the formation of any bubble or the like can be suppressed, and it is possible to suppress the occurrence of the inconvenience which would be otherwise caused such that the central portion AR3, which is disposed in the area between the projection optical system PL and the substrate P, is not smoothly filled with the liquid 1, as compared with the case in which the liquid 1 is supplied simultaneously from the supply ports 13A, 14A disposed on the both sides in the state in which the substrate P is allowed to stand still.

On the other hand, when the liquid 1 is supplied while moving the substrate P, it is possible to start the supply of the liquid 1 substantially simultaneously from the supply ports 13A, 14A disposed on the both sides. In this procedure, it is possible to suppress the occurrence of the inconvenience which would be otherwise caused such that the central portion AR3, which is disposed in the area between the projection optical system PL and the substrate P, is not smoothly filled with the liquid 1, because the substrate P is moved.

When the liquid 1 is supplied onto the substrate P from the supply ports 13A, 14A disposed on the both sides respectively, the supply can be started in different amounts from the supply ports 13A, 14A disposed on the both sides. For example, when the supply of the liquid 1 is started while moving the substrate P in the +X direction as in the embodiment described above, the liquid supply amount per unit time from the supply port 13A disposed on the −X side with respect to the projection area AR1 is made larger than the liquid supply amount per unit time from the supply port 14A disposed on the +X side. Accordingly, it is possible to suppress the formation of any bubble in the liquid immersion area AR2 while suppressing the occurrence of the inconvenience which would be otherwise caused such that the portion in the vicinity of the central portion AR3 in the area between the projection optical system PL and the substrate P is not filled with the liquid 1. That is, as shown in FIG. 5, when the supply port 14A disposed on the +X side does not supply the liquid 1, the internal space 14H of the supply member 14 of the supply port 14A is in the state of being filled with the gas (air). Therefore, an inconvenience may be possibly caused such that a part of the gas enters into the liquid immersion area AR2 via the supply port 14A. However, when a minute amount of the liquid 1 is also supplied from the supply port 14A onto the substrate P, and the internal space 14H of the supply member 14 is filled with the liquid 1, then it is possible to avoid the occurrence of the inconvenience which would be otherwise caused such that the gas contained in the internal space 14H enters into the liquid immersion area AR2 when the supply of the liquid 1 is started from the supply port 14A during the operation for forming the liquid immersion area before the exposure process and/or upon the start of the exposure process.

When the liquid 1 is supplied approximately simultaneously from the supply ports 13A, 14A disposed on the both sides while moving the substrate P, it is preferable that the supply of the liquid 1 is started while moving the substrate P in the X axis direction. However, the liquid immersion area AR2 can be also formed, for example, even when the liquid 1 is supplied while moving the substrate P in the Y axis direction or in the oblique direction.

When the liquid 1 is supplied while moving the substrate P in the X axis direction, the supply of the liquid 1 may be started by from another supply port provided separately from the supply ports 13A, 14A at any position deviated in relation to the scanning direction, for example, in the ±Y direction or in any oblique direction with respect to the projection area AR1 without performing the supply of the liquid 1 from the supply ports 13A, 14A arranged on the both sides of the projection area AR1 in relation to the scanning direction. Alternatively, the supply may be started by combining the another supply port and the supply ports 13A, 14A. The supply from the another supply port may be stopped after the formation of the liquid immersion area AR2, and the exposure process may be performed while supplying the liquid 1 from the supply ports 13A, 14A.

On the other hand, the following procedure is also available. That is, the supply of the liquid 1 is started, while moving the substrate P in parallel to the X axis direction, by using the supply ports 13A, 14A arranged on the both sides of the projection area AR1 in relation to the scanning direction (X axis direction) when the scanning exposure is performed for the plurality of shot areas S1 to S12 set on the substrate P as in the embodiment described above. Accordingly, the exposure process can be started for the first shot area S1 of the substrate P immediately after the liquid immersion area AR2 is formed.

Another supply ports may be provided on the both sides of the projection area AR1 in relation to the non-scanning direction (Y axis direction) to form the liquid immersion area by starting the supply of the liquid 1 from these supply ports while moving the substrate P in the Y axis direction. After (or before) stopping the supply of the liquid 1 from the another supply ports, the supply of the liquid 1 may be started from the supply ports 13A, 14A to perform the exposure process.

The embodiment of the present invention is constructed such that the liquid 1 is supplied from only one supply port 13A during the operation for forming the liquid immersion area before the exposure process, the supply of the liquid 1 is started from the both supply ports 13A, 14A after forming the liquid immersion area, and then the exposure process is started. However, the following procedure may be also adopted. That is, the supply of the liquid 1 is started from only the supply port 13A disposed on one side during the operation for forming the liquid immersion area before the exposure process, and the supply of the liquid 1 is started from the supply ports 13A, 14A disposed on the both sides after the elapse of a predetermined period of time. In other words, the operation for supplying the liquid is started by using the supply ports 13A, 14A disposed on the both sides at an intermediate timing during the operation for forming the liquid immersion area before the exposure process. Accordingly, it is also possible to form the liquid immersion area AR2 quickly and smoothly.

The direction of movement of the substrate P upon the start of the supply of the liquid 1 may be determined depending on the direction of movement of the substrate P upon the scanning exposure for the first shot area S1 on the substrate P. For example, when the first shot area S1 is subjected to the exposure while moving the substrate P in the +X direction, the exposure for the first shot area S1 can be started without any unnecessary movement of the substrate stage PST by starting the supply of the liquid 1 during the movement of the substrate P in the −X direction to be performed immediately therebefore.

It is preferable that the liquid supply amount per unit time from the supply port 13A (or 14A) during the operation for forming the liquid immersion area before the exposure process is approximately the same as the liquid supply amount during the exposure process. If the liquid supply amount during the operation for forming the liquid immersion area before the exposure process is different from the liquid supply amount during the exposure process, any waiting period of time is required until the supply amount of the liquid is stabilized, for example, when the supply amount during the operation for forming the liquid immersion area is switched into the liquid supply amount during the exposure process. However, when the liquid supply amount before the exposure process is the same as the liquid supply amount during the exposure process, then it is unnecessary to provide any waiting period of time, and it is possible to improve the throughput.

When the liquid 1 is supplied in order to form the liquid immersion area AR2 before the exposure process, the movement velocity of the substrate P may be either constant or irregular. The movement velocity of the substrate stage PST before the exposure process may be either the same as or different from the movement velocity during the exposure process. During the operation for forming the liquid immersion area before the exposure process, the substrate P may be moved in the predetermined direction (+X direction) while repeating the movement and the stop of the substrate P. Alternatively, the liquid 1 may be supplied while swinging the substrate P (substrate stage PST) in the XY plane.

During the operation for forming the liquid immersion area before the exposure process, the following procedure can be also adopted. That is, for example, the liquid 1 is supplied from the supply port 13A (or from both of the supply ports 13A, 14A) while moving the substrate P in the +X direction, and then the liquid 1 is supplied from the supply port 14A (or from both of the supply ports 13A, 14A) while moving the substrate P in the −X direction. This operation is repeated a predetermined number of times.

The supply of the liquid 1 from the liquid supply mechanism 10 may be started in a state in which the substrate P is positioned just below the projection optical system PL. Alternatively, the supply of the liquid 1 from the liquid supply mechanism 10 may be started in a state in which the flat surface around the substrate P (upper surface of the substrate stage PST) is positioned just below the projection optical system PL.

The liquid 1, which is disposed on the image plane side of the projection optical system PL, may be recovered every time when the exposure is completed for one piece of the substrate. Alternatively, the liquid 1 may be recovered every time when the exposure is completed for a plurality of pieces of the substrates or only when the recovery is required, for example, upon the maintenance, on condition that the liquid 1 can be continuously retained on the image plane side of the projection optical system PL during the exchange of the substrate P as well. In any case, the procedure as explained in the embodiment described above is carried out when the supply of the liquid is started from the liquid supply mechanism 10 thereafter. Accordingly, it is possible to quickly form the liquid immersion area containing no bubble or no air mass (void).

When a sensor or the like, which judges whether or not the liquid immersion area AR2 is formed, is installed beforehand, the exposure can be started for the first shot area S1 after confirming the output of the sensor. Alternatively, the exposure may be started for the first shot area S1 after the elapse of a predetermined waiting period of time after the start of the supply of the liquid from the liquid supply mechanism 10.

In the embodiment described above, pure water is used as the liquid 1. Pure water is advantageous in that pure water is available in a large amount with ease, for example, in the semiconductor production factory, and pure water exerts no harmful influence, for example, on the optical element (lens) and the photoresist on the substrate P. Further, pure water exerts no harmful influence on the environment, and the content of impurity is extremely low. Therefore, it is also expected to obtain the function to wash the surface of the substrate P and the surface of the optical element provided at the end surface of the projection optical system PL.

It is approved that the refractive index n of pure water (water) with respect to the exposure light beam EL having a wavelength of about 193 nm is approximately in an extent of 1.44. When the ArF excimer laser beam (wavelength: 193 nm) is used as the light source of the exposure light beam EL, then the wavelength is shortened on the substrate P by 1/n, i.e., to about 134 nm, and a high resolution is obtained. Further, the depth of focus is magnified about n times, i.e., about 1.44 times as compared with the value obtained in the air. Therefore, when it is enough to secure an approximately equivalent depth of focus as compared with the case of the use in the air, it is possible to further increase the numerical aperture of the projection optical system PL. Also in this viewpoint, the resolution is improved.

In this embodiment, the optical element 2 is attached to the end of the projection optical system PL. The lens can be used to adjust the optical characteristics of the projection optical system PL, for example, the aberration (for example, spherical aberration and comatic aberration). The optical element to be attached to the end of the projection optical system PL may be an optical plate to be used for adjusting the optical characteristic of the projection optical system PL. Alternatively, the optical element may be a plane parallel plate through which the exposure light beam EL is transmissive.

When the pressure, which is generated by the flow of the liquid 1, is large between the substrate P and the optical element disposed at the end of the projection optical system PL, it is also allowable that the optical element is tightly fixed so that the optical element is not moved by the pressure, rather than allowing the optical element to be exchangeable.

The embodiment of the present invention is constructed such that the space between the projection optical system PL and the surface of the substrate P is filled with the liquid 1. However, the following arrangement may be also adopted. That is, the space may be filled with the liquid 1 in a state in which a cover glass constructed of a plane parallel plate is attached, for example, to the surface of the substrate P.

The liquid 1 is water in this embodiment. However, the liquid 1 may be any liquid other than water. For example, when the light source of the exposure light beam EL is the $F_2$ laser, the $F_2$ laser beam is not transmitted through water. Therefore, in this case, liquids preferably usable as the liquid 1 may include, for example, a fluorine-based fluid such as fluorine-based oil and perfluoropolyether (PFPE) through which the $F_2$ laser beam is transmissive. Alternatively, other than the above, it is also possible to use, as the liquid 1, liquids (for example, cedar oil) which have the transmittance with respect to the exposure light beam EL, which have the refractive index as high as possible, and which are stable against the photoresist coated on the surface of the substrate P and the projection optical system PL. Also in this case, the surface treatment is performed depending on the polarity of the liquid 1 to be used.

The substrate P, which is usable in the respective embodiments described above, is not limited to the semiconductor wafer for producing the semiconductor device. The applicable substrates include, for example, the glass substrate for the display device, the ceramic wafer for the thin film magnetic head, and the master plate (synthetic quartz, silicon wafer) for the mask or the reticle to be used for the exposure apparatus.

As for the exposure apparatus EX, the present invention is also applicable to the scanning type exposure apparatus (scanning stepper) based on the step-and-scan system for performing the scanning exposure for the pattern of the mask M by synchronously moving the mask M and the substrate P as well as the projection exposure apparatus (stepper) based on the step-and-repeat system for performing the full field exposure for the pattern of the mask M in a state in which the mask M and the substrate P are allowed to stand still, while successively step-moving the substrate P. The present invention is also applicable to the exposure apparatus based on the step-and-stitch system in which at least two patterns are partially overlaid and transferred on the substrate P.

The present invention is also applicable to a twin-stage type exposure apparatus provided with two stages in which the substrates such as the wafers to be processed are placed separately so that the substrates can be moved independently in the XY directions. The structure and the exposure operation of the twin-stage type exposure apparatus are disclosed, for example, in Japanese Patent Application Laid-open Nos. 10-163099 and 10-214783 (corresponding to U.S. Pat. Nos. 6,341,007, 6,400,441, 6,549,269, and 6,590,634), Published Japanese Translation of PCT Application No. 2000-505958 (corresponding to U.S. Pat. No. 5,969,441), and U.S. Pat. No. 6,208,407, contents of which are incorporated herein by reference within a range of permission of the domestic laws and ordinances of the state designated or selected in this international application.

As for the type of the exposure apparatus EX, the present invention is not limited to the exposure apparatus for the semiconductor device production for exposing the substrate P with the semiconductor device pattern. The present invention is also widely applicable, for example, to the exposure apparatus for producing the liquid crystal display device or for producing the display as well as the exposure apparatus for producing, for example, the thin film magnetic head, the image pickup device (CCD), the reticle, or the mask.

When the linear motor is used for the substrate stage PST and/or the mask stage MST, it is allowable to use any one of those of the air floating type based on the use of the air bearing and those of the magnetic floating type based on the use of the Lorentz's force or the reactance force. Each of the stages PST, MST may be either of the type in which the movement is effected along the guide or of the guideless type in which no guide is provided. An example of the use of the linear motor for the stage is disclosed in U.S. Pat. Nos. 5,623,853 and 5,528,118, contents of which are incorporated herein by reference respectively within a range of permission of the domestic laws and ordinances of the state designated or selected in this international application.

As for the driving mechanism for each of the stages PST, MST, it is also allowable to use a plane motor in which a magnet unit provided with two-dimensionally arranged magnets and an armature unit provided with two-dimensionally arranged coils are opposed to one another, and each of the stages PST, MST is driven by the electromagnetic force. In this arrangement, any one of the magnet unit and the armature unit is connected to the stage PST, MST, and the other of the magnet unit and the armature unit is provided on the side of the movable surface of the stage PST, MST.

The reaction force, which is generated in accordance with the movement of the substrate stage PST, may be mechanically released to the floor (ground) by using a frame member so that the reaction force is not transmitted to the projection optical system PL. The method for handling the reaction force is disclosed in detail, for example, in U.S. Pat. No. 5,528,118 (Japanese Patent Application Laid-open No. 8-166475), contents of which are incorporated herein by reference within a range of permission of the domestic laws and ordinances of the state designated or selected in this international application.

The reaction force, which is generated in accordance with the movement of the mask stage MST, may be mechanically released to the floor (ground) by using a frame member so that the reaction force is not transmitted to the projection optical system PL. The method for handling the reaction force is disclosed in detail, for example, in U.S. Pat. No. 5,874,820 (Japanese Patent Application Laid-open No. 8-330224), contents of which are incorporated herein by reference within a range of permission of the domestic laws and ordinances of the state designated or selected in this international application.

The exposure apparatus EX according to the embodiment of the present invention is produced by assembling the various subsystems including the respective constitutive elements as defined in claims so that the predetermined mechanical accuracy, the electric accuracy, and the optical accuracy are maintained. In order to secure the various accuracies, adjustments performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature and the cleanness are managed.

Figure 8:
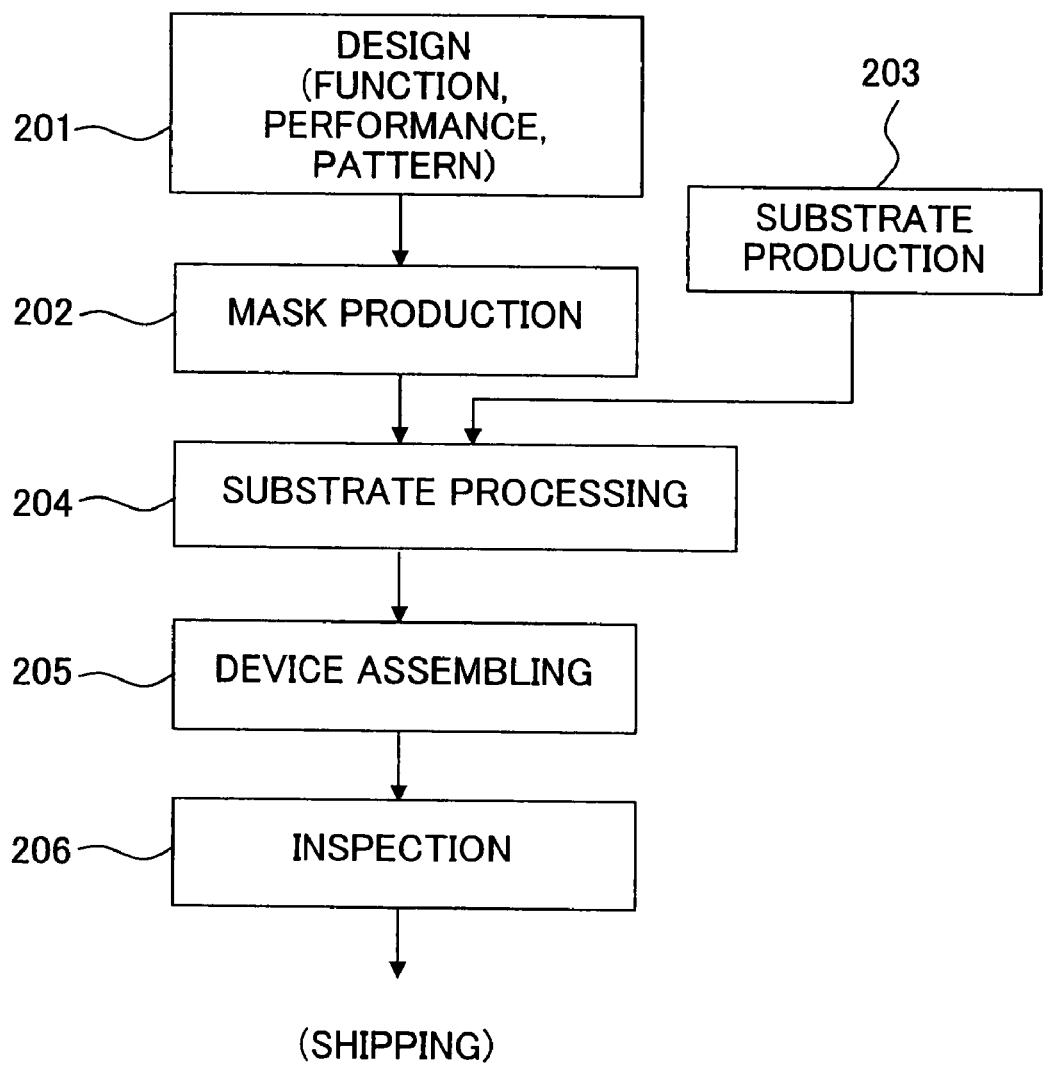
FIG. 8 shows a flow chart illustrating exemplary steps of producing a semiconductor device.

As shown in FIG. 8, the microdevice such as the semiconductor device is produced by performing, for example, a step 201 of designing the function and the performance of the microdevice, a step 202 of manufacturing a mask (reticle) based on the designing step, a step 203 of producing a substrate as a base material for the device, a substrate processing step 204 of exposing the substrate with a pattern of the mask by using the exposure apparatus EX of the embodiment described above, a step 205 of assembling the device (including a dicing step, a bonding step, and a packaging step), and an inspection step 206.

According to the present invention, the optical path space on the image plane side of the projection optical system can be quickly filled with the liquid while suppressing the formation of any bubble or the like. Therefore, the exposure process can be performed at the high throughput without causing any deterioration of the image of the pattern.

The invention claimed is:

1. An exposure apparatus which exposes a substrate by projecting an image of a pattern through a liquid onto the substrate, the exposure apparatus comprising:
    a projection optical system which projects the image of the pattern onto the substrate;
    a liquid supply mechanism which has supply ports for supply of the liquid; and
    a substrate-moving unit which moves the substrate, wherein:
    the supply of the liquid by the liquid supply mechanism is started while moving the substrate with the substrate-moving unit.

2. The exposure apparatus according to claim 1, wherein the supply of the liquid is started while moving the substrate substantially in parallel to a straight line which connects the supply ports and a projection area onto which the image of the pattern is to be projected.

3. The exposure apparatus according to claim 2, wherein a plurality of shot areas on the substrate are exposed respectively while moving the substrate in a predetermined scanning direction, and the straight line, which connects the projection area and the supply ports, is substantially in parallel to the scanning direction.

4. The exposure apparatus according to claim 1, wherein the supply ports are arranged on both sides of a projection area onto which the image of the pattern is to be projected, and the supply is started substantially simultaneously from the supply ports disposed on the both sides.

5. The exposure apparatus according to claim 4, wherein the supply is started in different amounts from the supply ports disposed on the both sides.

6. The exposure apparatus according to claim 1, wherein a plurality of shot areas on the substrate are exposed respectively while moving the substrate along a predetermined scanning axis, and a direction of movement of the substrate along the predetermined scanning axis that is adopted when the supply of the liquid is started, is determined depending on a direction of movement of the substrate along the predetermined scanning axis to be adopted when a first shot area of the plurality of shot areas is exposed.

7. The exposure apparatus according to claim 6, wherein the direction of movement of the substrate along the predetermined scanning axis, that is adopted when the supply of the liquid is started, is opposite to the scanning direction to be adopted when the first shot area, to which the liquid is supplied, is exposed.

8. The exposure apparatus according to claim 7, wherein the liquid is supplied from a supply port of the supply ports disposed rearward in the direction of movement of the substrate along the predetermined scanning axis when the liquid supply mechanism starts the supply of the liquid.

9. The exposure apparatus according to claim 1, wherein the supply ports are arranged on both sides of a projection area onto which the image of the pattern is to be projected, and the supply of the liquid is started from only one supply port of the supply ports disposed on the both sides.

10. The exposure apparatus according to claim 1, further comprising a control unit which controls the liquid supply mechanism so that the supply of the liquid by the liquid supply mechanism is started while moving the substrate by the substrate-moving unit.

11. The exposure apparatus according to claim 1, wherein the substrate-moving unit is a substrate stage which is movable while holding the substrate, and the control unit controls movement of the substrate stage.

12. A method for producing a device, comprising using the exposure apparatus as defined in claim 1.

13. An exposure method for exposing a substrate by projecting an image of a pattern through a liquid onto the substrate, the exposure method comprising:
    starting supply of the liquid to a projection area onto which the image of the pattern is to be projected while moving the substrate before performing exposure operation; and
    exposing the substrate by projecting the image of the pattern onto the substrate through the supplied liquid.

14. The exposure method according to claim 13, wherein the substrate is moved in a predetermined scanning direction during the exposure of the substrate, and a straight line, which connects the projection area and a position for supplying the liquid, is substantially in parallel to the scanning direction.

15. The exposure method according to claim 13, wherein the supply of the liquid is started from both sides of the projection area before the exposure operation.

16. The exposure method according to claim 13, wherein the supply of the liquid is started from one side of the projection area before the exposure operation.

17. The exposure method according to claim 13, wherein a plurality of shot areas on the substrate are exposed respectively while moving the substrate along a predetermined scanning axis, and a direction of movement of the substrate along the predetermined scanning axis, that is adopted when the supply of the liquid is started, is determined depending on a direction of movement of the substrate along the predetermined scanning axis, adopted when a first shot area of the plurality of the shot areas is exposed.

18. An exposure method for exposing a substrate by projecting an image of a pattern through a liquid onto the substrate with a projection optical system, the exposure method comprising:
    starting supply of the liquid to a projection area onto which the image of the pattern is to be projected, while moving an object arranged on an image plane side of the projection optical system before performing exposure operation; and
    exposing the substrate by projecting the image of the pattern onto the substrate through the liquid between the projection optical system and the substrate.

19. The exposure method according to claim 18, wherein the object includes the substrate.

20. The exposure method according to claim 18, wherein the supply of the liquid is started from both of first and second sides of the projection area.

* * * * *